(12) United States Patent
Ryu et al.

(10) Patent No.: US 7,442,565 B2
(45) Date of Patent: Oct. 28, 2008

(54) METHOD FOR MANUFACTURING VERTICAL STRUCTURE LIGHT EMITTING DIODE

(75) Inventors: Yung Ho Ryu, Seoul (KR); Hae Youn Hwang, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 215 days.

(21) Appl. No.: 11/522,407

(22) Filed: Sep. 18, 2006

(65) Prior Publication Data

US 2007/0099317 A1    May 3, 2007

(30) Foreign Application Priority Data

Sep. 23, 2005    (KR) ................ 10-2005-0088894

(51) Int. Cl.
    *H01L 21/00*    (2006.01)
(52) U.S. Cl. .................. 438/26; 438/25; 438/27
(58) Field of Classification Search .......... 438/22, 438/25–28, 113, 458, 464
See application file for complete search history.

(56) References Cited

U.S. PATENT DOCUMENTS

| | | | | |
|---|---|---|---|---|
| 6,071,795 | A | * | 6/2000 | Cheung et al. .............. 438/458 |
| 6,930,327 | B2 | * | 8/2005 | Maeda et al. .................. 257/59 |
| 7,172,945 | B2 | * | 2/2007 | Shioga et al. ................ 438/393 |
| 2004/0079951 | A1 | | 4/2004 | Horng et al. |
| 2005/0017253 | A1 | | 1/2005 | Hata |
| 2005/0095734 | A1 | * | 5/2005 | Hasebe et al. ................ 438/17 |

FOREIGN PATENT DOCUMENTS

| DE | 100 51 465 A1 | 5/2002 |
|---|---|---|
| KR | 10-0495215 | 6/2005 |

OTHER PUBLICATIONS

German Office Action, with English Translation, issued in corresponding German Patent Application No. DE 10 2006 043 843.4-33, issued on Nov. 16, 2007.

* cited by examiner

*Primary Examiner*—Kevin M Picardat
(74) *Attorney, Agent, or Firm*—McDermott Will & Emery LLP

(57) ABSTRACT

A method for manufacturing a vertical light emitting diode of the invention allows an easier process of individually separating chips. A light emitting structure is formed on a growth substrate having a plurality of device areas and at least one device isolation area. The light emitting structure has an n-type clad layer, an active layer and a p-type clad layer sequentially formed therein. Corresponding p-type electrodes are formed on the light emitting structure on the device areas. A glass substrate having through holes perforated therein is provided on the p-electrodes so that the through holes are disposed corresponding to the p-electrodes. Also, the through holes are plated with a metal material to form patterns of a plating layer on the p-electrodes. Then, the growth substrate is removed to form n-electrodes on the n-type clad layer. The glass substrate is removed via etching.

15 Claims, 8 Drawing Sheets

METHOD FOR MANUFACTURING VERTICAL STRUCTURE LIGHT EMITTING DIODE

RELATED APPLICATION

This application claims the benefit of Korean Patent Application No. 2005-88894 filed on Sep. 23, 2005 in the Korean Intellectual Property Office, the disclosure of which is incorporated herein by reference.

BACKGROUND OF THE INVENTION

1. Field of the Invention

The present invention relates to a method for manufacturing alight emitting device, more particularly, which allows an easier process of individually separating chips.

2. Description of the Related Art

A GaN-based semiconductor having a composition expressed by $Al_xGa_yIn_{(1-x-y)}N$, where $0 \leq x \leq 1$, $0 \leq y \leq 1$, $0 \leq x+y \leq 1$ is a compound semiconductor material suitable for emitting blue and ultraviolet ray light. Accordingly the GaN-based semiconductor is utilized in a blue or green light emitting diode. The GaN-based LED currently in use is broken down into a planar GaN-based LED and a vertical GaN-based LED. The planar GaN-based LED has p- and n-electrodes in an upper part thereof facing the same direction. Thus, to achieve a sufficient light emitting area, the LED device should be relatively large-sized. Also, due to proximity between the p- and n-electrodes, the planar GaN-based LED is susceptible to electrostatic discharge (ESD).

A vertical GaN-based LED may be employed in place of the planar GaN-based LED with the aforesaid drawbacks. In the vertical GaN-based LED, the p- and n-electrodes are formed on opposed faces between GaN-based epitaxial layers. In a process to manufacture the vertical GaN-based LED, typically, a conductive substrate (e.g. a Si or GaAs substrate) is bonded and an insulating substrate (e.g. a sapphire substrate) is separated. The Korean Patent Application Publication No. 2004-58479 discloses a method for manufacturing a vertical GaN-based LED which involves processes of bonding the Si substrate, separating the sapphire substrate and dicing the Si substrate.

FIGS. 1a to 1f are cross-sectional views illustrating a method for manufacturing a vertical GaN-based light emitting diode according to the prior art. First, referring to FIG. 1a, an n-type clad layer 15a, an active layer 15b and a p-typ clad layer 15c are sequentially formed on a sapphire substrate 11 to obtain a light emitting structure 15. Then, as shown in FIG. 1b, a trench 20 is formed to separate the light emitting structure 15 into individual device areas and then a p-electrode 16 is formed on the p-type clad layer 15c of each device area. Subsequently, as shown in FIG. 1c, a conductive substrate 21 of e.g. Si is bonded to the p-electrode 16 via a conductive adhesive layer of e.g. Au 17. Next, a laser beam 18 is irradiated to separate the sapphire substrate 11 by laser lift-off. This produces a structure having the sapphire substrate 11 removed therefrom, as shown in FIG. 1d. Then, as shown in FIG. 1e, an n-electrode 19 is formed on the n-type clad layer 15a. Thereafter, as shown in FIG. 1f, the resultant structure of FIG. 1e is cut into individual chips (chip separation process). This produces a plurality of vertical light emitting diodes 10 at the same time.

In this conventional method, the conductive substrate 21 is cut into individual devices to separate chips. However to cut the conductive substrate 21 necessitates complicated processes such as dicing, scribing and breaking. Here, in the dicing process, the substrate 21 is cut with a cutting wheel. Therefore, this cutting process increases manufacturing costs and delays an overall process. Moreover, the Si substrate or GaSs substrate employed as the conductive substrate 21 releases heat poorly due to low thermal conductivity thereof, also degrading device properties when a high current is applied. Further, the conductive substrate 21 is bonded at a high temperature of 200° C. or more so that the light emitting structure 15 is prone to cracks. In addition to the GaN-based LED, this problem may arise in manufacturing the vertical LED adopting other group III-V AlGaInP-based or AlGaAs-based compound semiconductor.

SUMMARY OF THE INVENTION

The present invention has been made to solve the foregoing problems of the prior art and therefore an object according to certain embodiments of the present invention is to provide a method for manufacturing a vertical light emitting diode which allows an easier process of individually separating chips, suppresses cracks in a light emitting structure and enhances heat releasing properties.

According to an aspect of the invention for realizing the object, there is provided a method for manufacturing a vertical light emitting diode comprising steps of:

forming a light emitting structure having an n-type clad layer, an active layer and a p-type clad layer sequentially formed therein on a growth substrate having a plurality of device areas and at least one device isolation area;

forming corresponding p-type electrodes on the light emitting structure on the device areas;

providing a glass substrate having through holes perforated therein on the p-electrodes so that the through holes are disposed corresponding to the p-electrodes;

plating the through holes with a metal material to form patterns of a plating layer on the p-electrodes;

removing the growth substrate to form n-electrodes on the n-type clad layer; and removing the glass substrate via etching.

According to an embodiment of the invention, the step of providing the glass substrate on the p-electrodes comprises: bonding the glass substrate onto the through holes perforated therein onto the p-electrodes.

According to another embodiment of the invention, the step of providing the glass substrate on the p-electrodes comprises:

bonding the glass substrate onto the p-electrodes;

perforating the through holes in the glass substrate so that the through holes are disposed corresponding to the p-electrodes.

According to further another embodiment of the invention, the manufacturing method further comprises: between the step of forming the light emitting structure and forming the p-electrodes, forming a trench in the light emitting structure on the device isolation area to separate the light emitting structure into individual device areas.

According to further another embodiment of the invention, the manufacturing method further comprises: after forming the p-electrodes, forming a trench in the light emitting structure on the device isolation area to separate the light emitting structure into individual device areas.

The plating layer comprises one selected from a group consisting of Au, Cu, Ni, Ag, Cr, W, Al, Pt, Sn, Pb, Fe, Ti, Mo, and alloys thereof.

According to a preferred embodiment of the invention, the manufacturing method further comprises: before forming the patterns of the plating layer, forming a plating seed layer on the p-electrodes. Here, the plating seed layer is formed via electroless plating or deposition.

According to the invention, the step of removing the growth substrate is carried out by one selected from a group consisting of physical, chemical and mechanical methods. For example, the growth substrate may be removed via Laser Lift-Off (LLO), Chemical Mechanical Polishing (CMP) or etching. The glass substrate and the patterns of the plating layer serve as a supporting member when the growth substrate is removed.

The n-type clad layer, the active layer and the p-type clad layer are made of a group III-V compound semiconductor material. Here, the growth substrate may be an insulating or conductive substrate.

According to further another embodiment of the invention, the p-type clad layer, the active layer and the p-type clad layer are made of a semiconductor material having a composition expressed by $Al_xGa_yIn_{(1-x-y)}N$, where $0 \leq x \leq 1$, $0 \leq y \leq 1$, $0 \leq x+y \leq 1$. Here, the growth substrate comprises a sapphire substrate.

According to further another embodiment of the invention, the n-type clad layer, the active layer and the p-type clad layer are made of a semiconductor material having a composition expressed by $Al_xGa_yIn_{(1-x-y)}P$, where $0 \leq x \leq 1$, $0 \leq y \leq 1$, $0 \leq x+y \leq 1$.

According to further another embodiment of the invention, the n-type clad layer, the active layer and the p-type clad layer are made of a semiconductor material having a composition expressed by $Al_xGa_{1-x}As$, where $023 \ x \leq 1$.

According to the invention, chips can be individually separated with ease by etching the glass substrate without a dicing or scribing process. This saves manufacturing costs and time. Moreover, the conductive substrate is formed via plating, thereby preventing cracks that occur during bonding of the conventional conductive substrate.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1A:
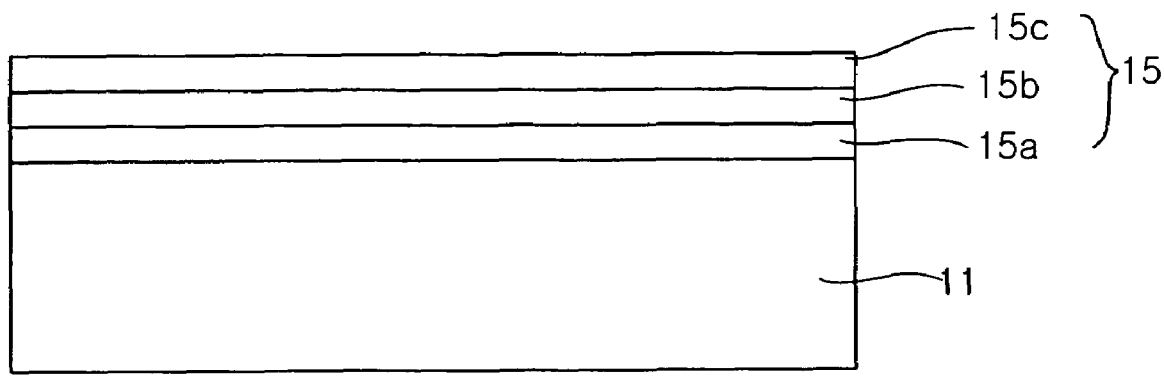
FIGS. 1a to 1f are cross-sectional views for explaining a method for manufacturing a vertical light emitting diode according to the prior art.
Figure 1B:
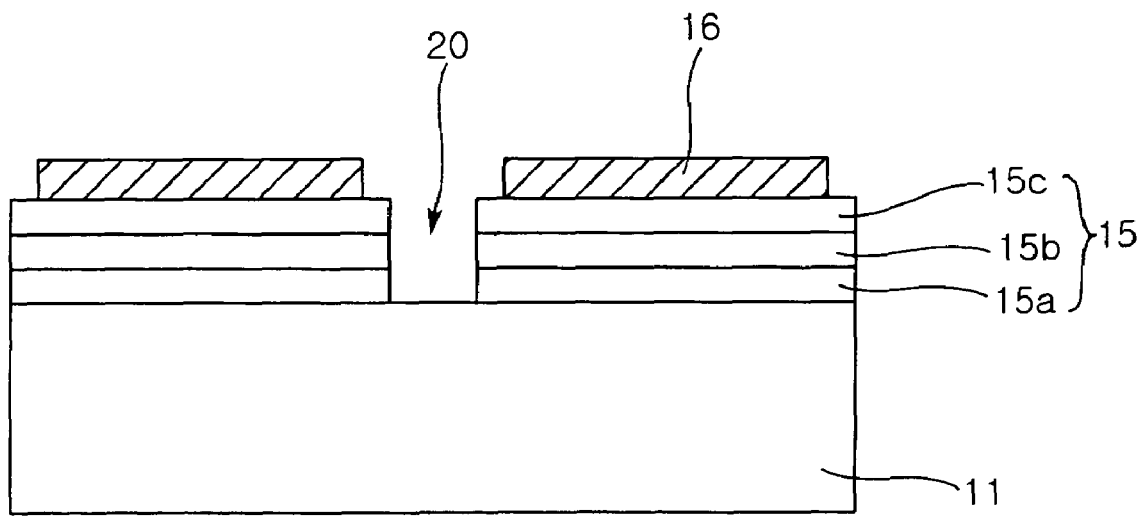
Figure 1C:
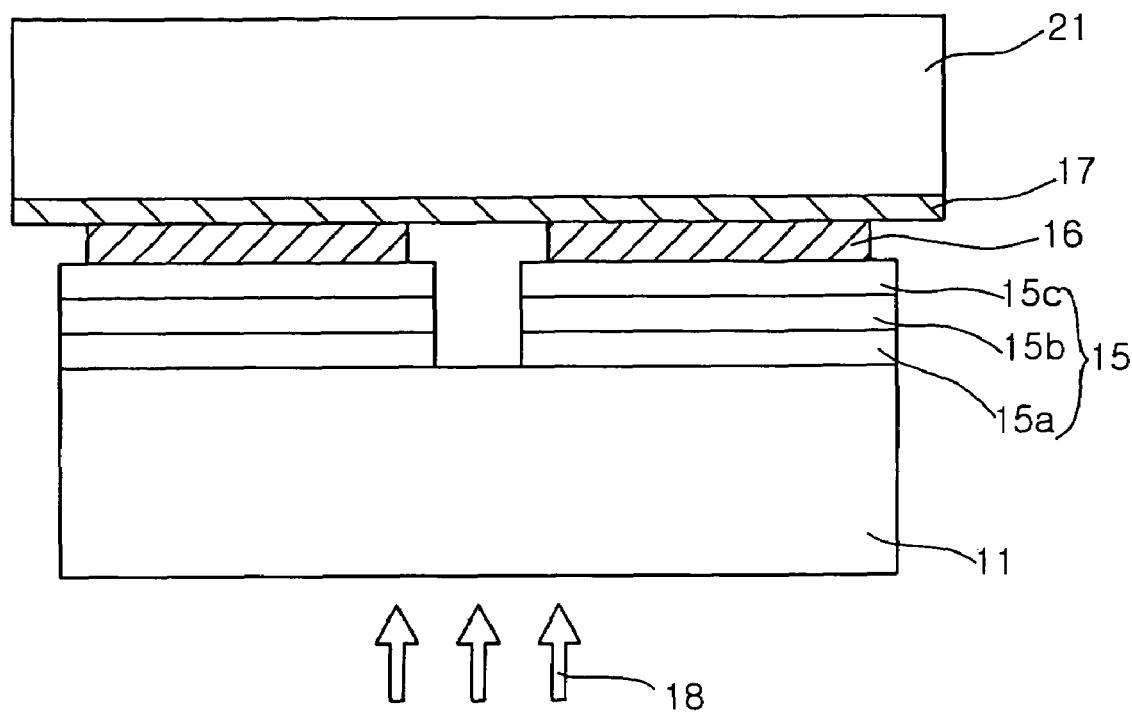
Figure 1D:
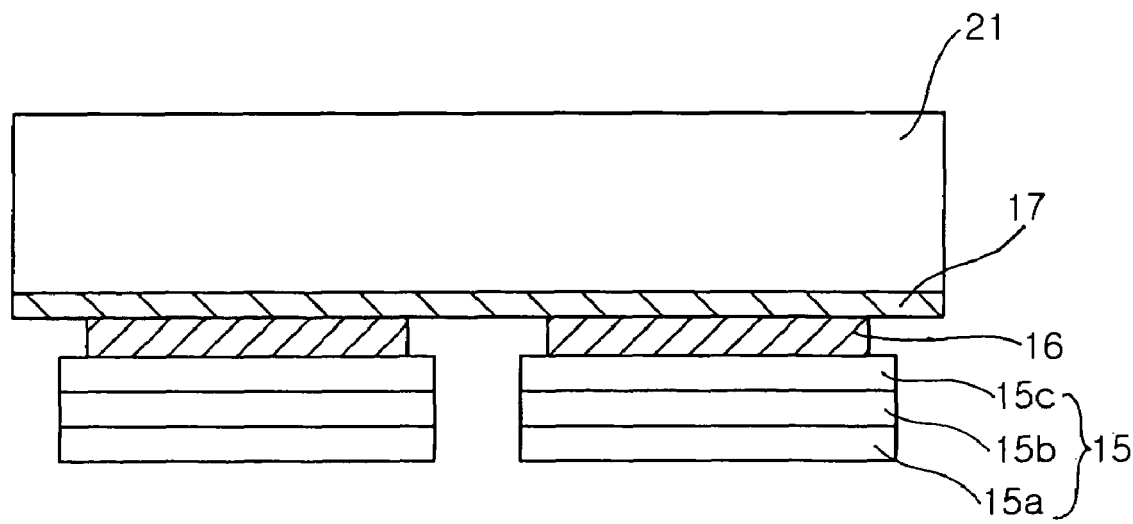
Figure 1E:
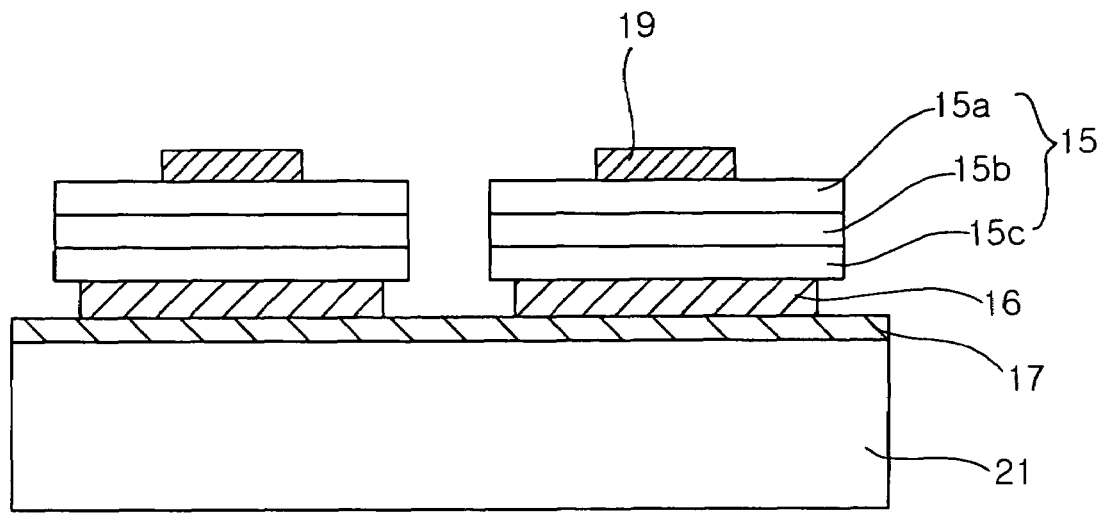
Figure 1F:
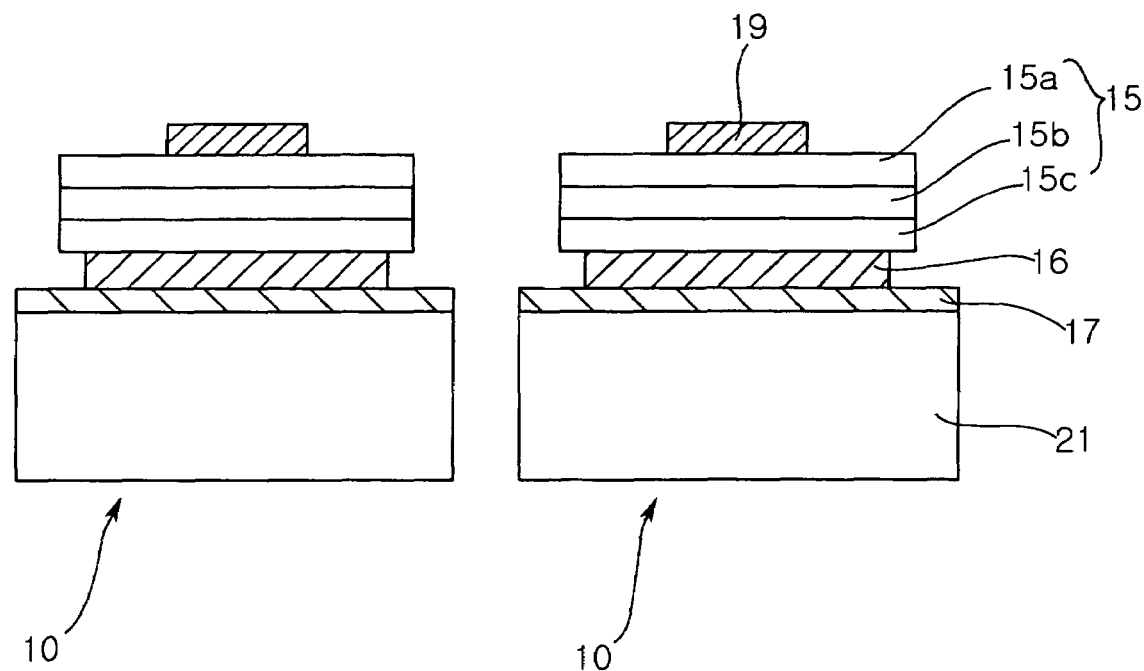

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference signs are used to designate the same or similar components throughout.

FIGS. 2 to 8 are cross-sectional views for explaining a method for manufacturing a vertical light emitting diode according to an embodiment of the invention. In manufacturing the light emitting diode, a sapphire substrate is used as a growth substrate and a GaN-based semiconductor having a composition expressed by $Al_xGa_yIn_{(1-x-y)}N$, where $0 \leq x \leq 1$, $0 \leq y \leq 1$, $0 \leq x+y \leq 1$ is adopted for a light emitting structure.

Figure 2:
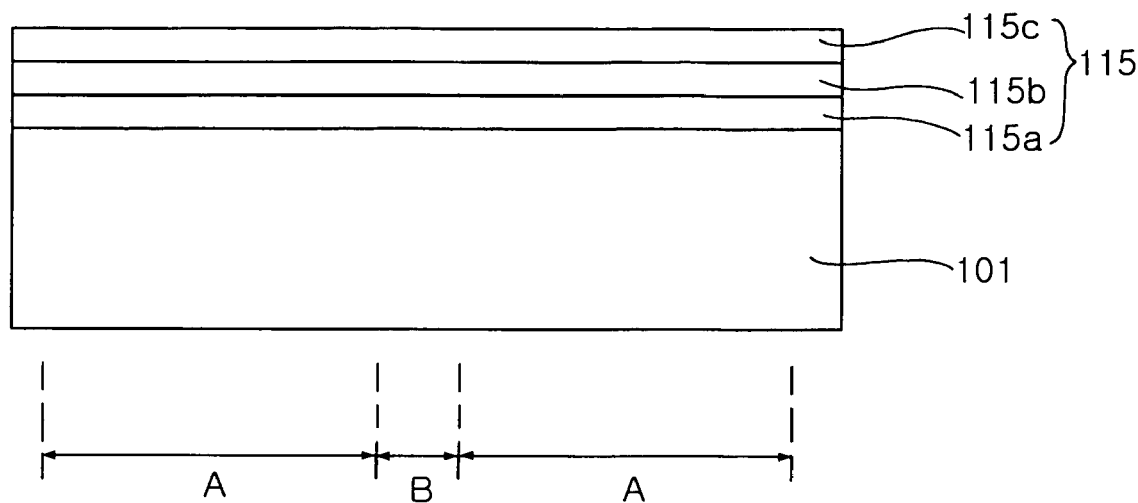
FIGS. 2 to 8 are cross-sectional views for explaining a method for manufacturing a vertical light emitting diode according to an embodiment of the invention.

First, referring to FIG. 2, an n-type clad layer 115a, an active layer 115b and a p-type clad layer 115c are sequentially formed on a sapphire substrate 110. This produces a light emitting structure 115 on the sapphire substrate 101. The sapphire substrate 101 with the light emitting structure 115 formed therein has a plurality of device areas A and at least one device isolation area B. The device areas A correspond to areas where light emitting diode chips are to be formed, and the device isolation area B corresponds to a boundary between the chips.

Figure 3:
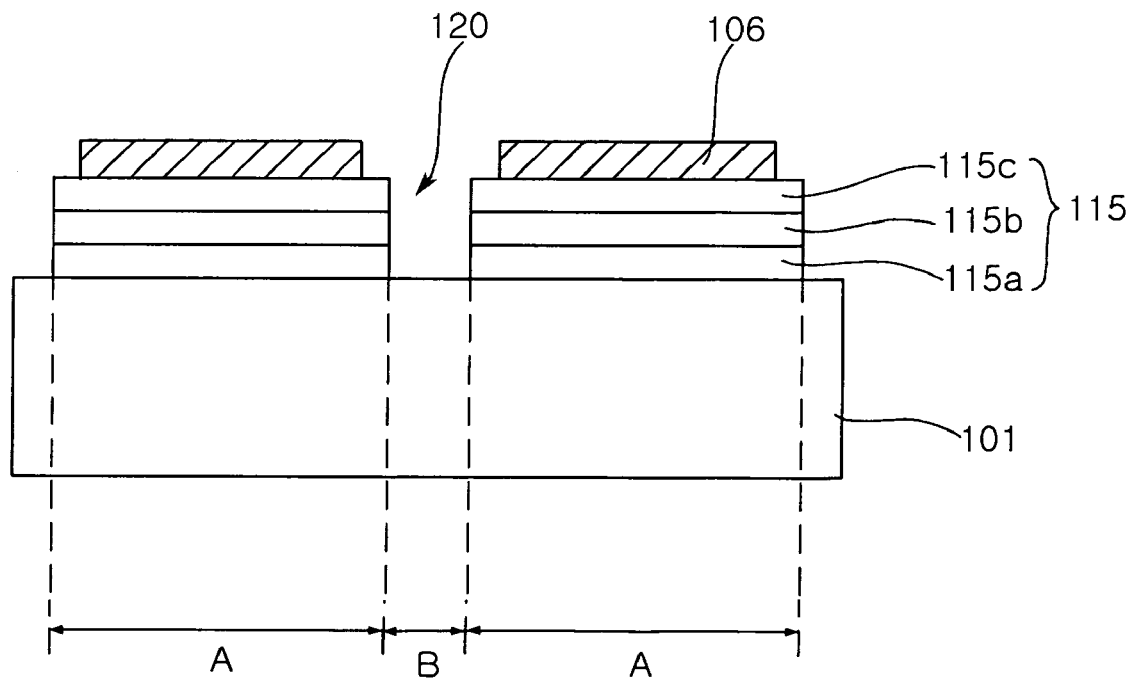

Then, as shown in FIG. 3, the light emitting structure 115 is removed from the device isolation area B to form a trench 120 for separating devices. This separates the light emitting structure 115 into individual device areas. Next, corresponding p-electrodes 106 are formed on the p-type clad layer 115c of the device areas. For example, the p-electrodes 106 may be constructed of a Pt/Au layer, an Ni/Au layer or an Ni/Ag/Pt layer. The p-electrodes 106 form an ohmic contact with the p-type semiconductor clad layer 115c.

Alternatively, the process of forming the trench 120 for separating the devices may be preceded by the process of forming the p-electrodes 106. That is, first, the p-electrodes 106 are formed on the p-type clad layer 115c and then the trench 120 for separating the devices is formed in the device isolation area B. Thus the light emitting structure 115 can be separated into individual devices.

Figure 4:
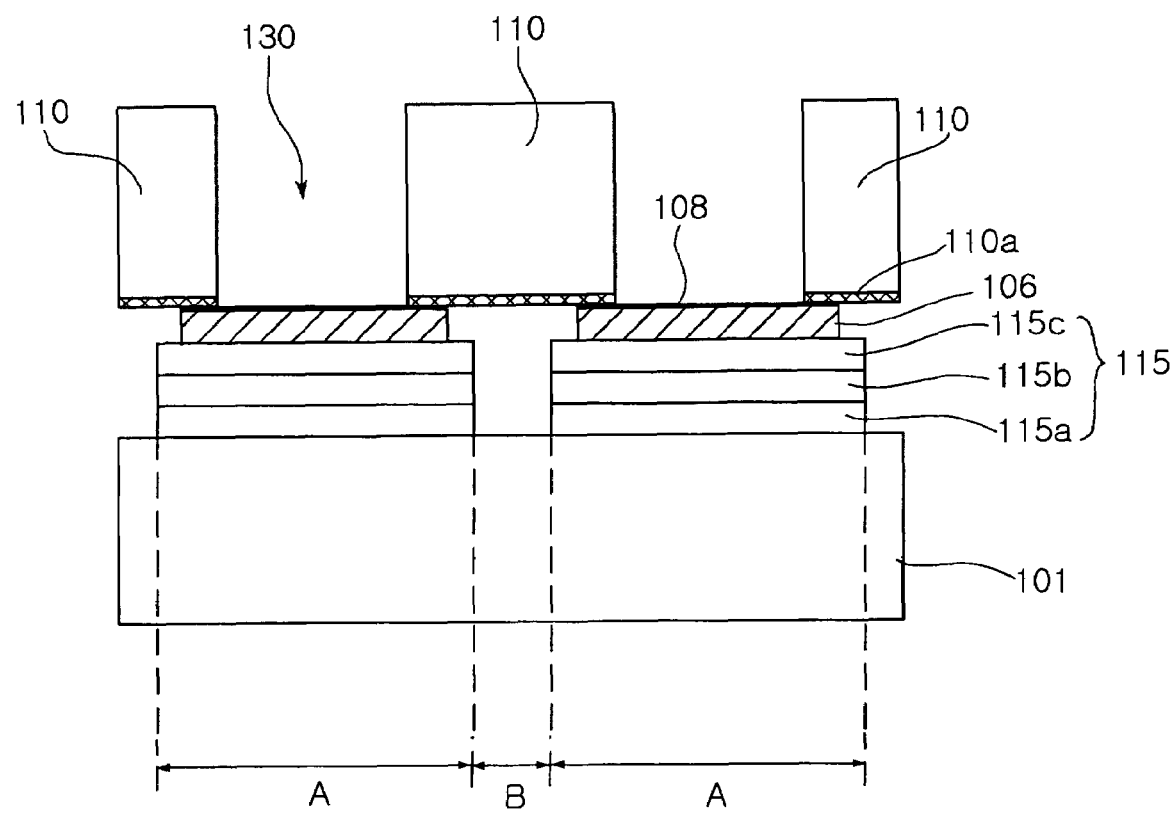

Next, as shown in FIG. 4, a plating seed layer 108 is formed on the p-electrodes 106 of the device areas A via electroless plating or deposition such as sputtering. The plating seed layer 108 serves as a seed to perform a later process of electroplating smoothly.

Thereafter, a glass substrate 110 is bonded onto the p-electrodes 106 using an adhesive layer 110a made of a dry film. The glass substrate 110 has through holes 130 perforated therein prior to bonding. The glass substrate 110, when bonded, is aligned with the p-electrodes 106 such that the through holes 130 thereof are disposed corresponding to the p-electrodes 106. Accordingly, the plating seed layer 108 is exposed through the through holes 130.

Alternatively, the glass substrate 110 without the through holes may be bonded onto the p-electrodes 106, and then the through holes 130 may be formed therein via wet or dry etching. The through holes 130, when formed in the glass substrate 110 bonded onto the p-electrodes 106, are disposed corresponding to the p-electrodes 106 of the device areas A.

Figure 5:
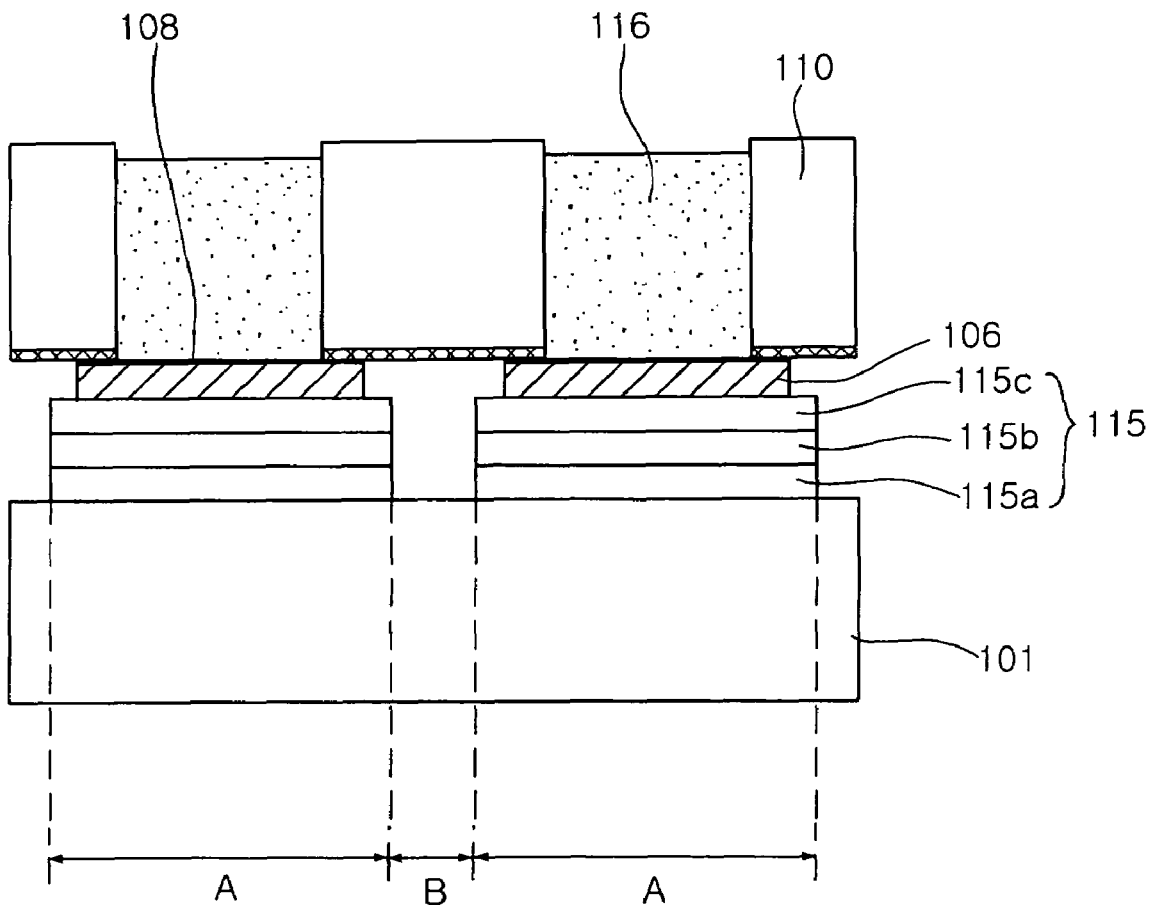

Thereafter, as shown in FIG. 5, the through holes 130 are plated with a metal material to selectively form patterns of a plating layer 116 on the p-electrodes 106 only in the device areas A. That is, the glass substrate 110 having the through holes 130 formed therein serves as a mask to electrically plate the plating seed layer 108 of the p-electrodes 106. The plating layer 116 is made of one selected from a group consisting of Au, Cu, Ni, Ag, Cr, W, Al, Pt, Sn, Pb, Fe, Ti, Mo and alloys thereof. As shown in FIG. 5, the plating layer 116 is structured as a single layer but may feature a multilayer structure.

Figure 6:
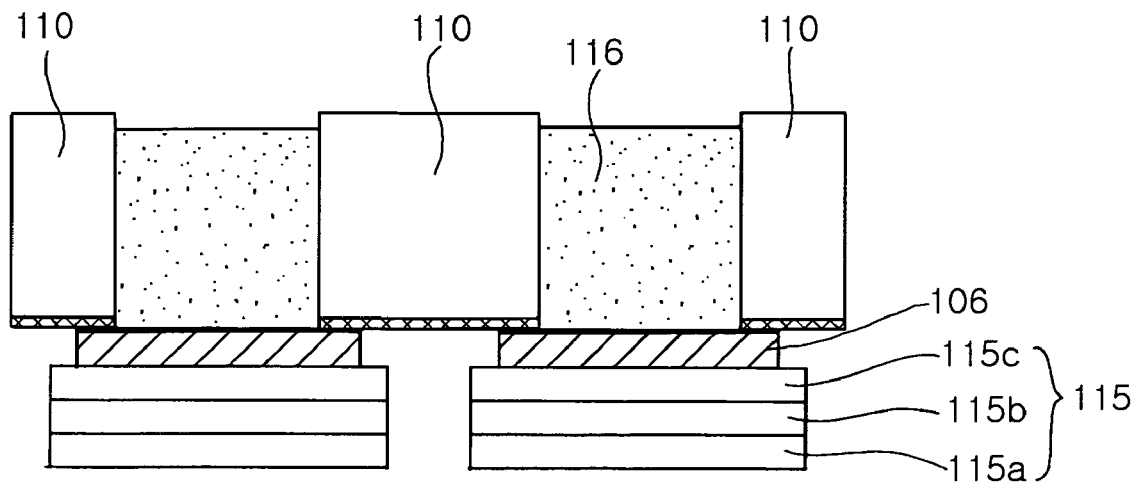

Subsequently, as shown in FIG. 6, a physical, chemical or mechanical method (e.g., laser lift-off) is employed to separate or remove the sapphire substrate 101 from the light emitting structure 115. Here, the glass substrate 110 and the plating layer 110 serve as a supporting substrate. The sapphire substrate 101 is removable via etching, chemical and mechanical polishing (CMP) or lapping in place of laser lift-off.

Figure 7:
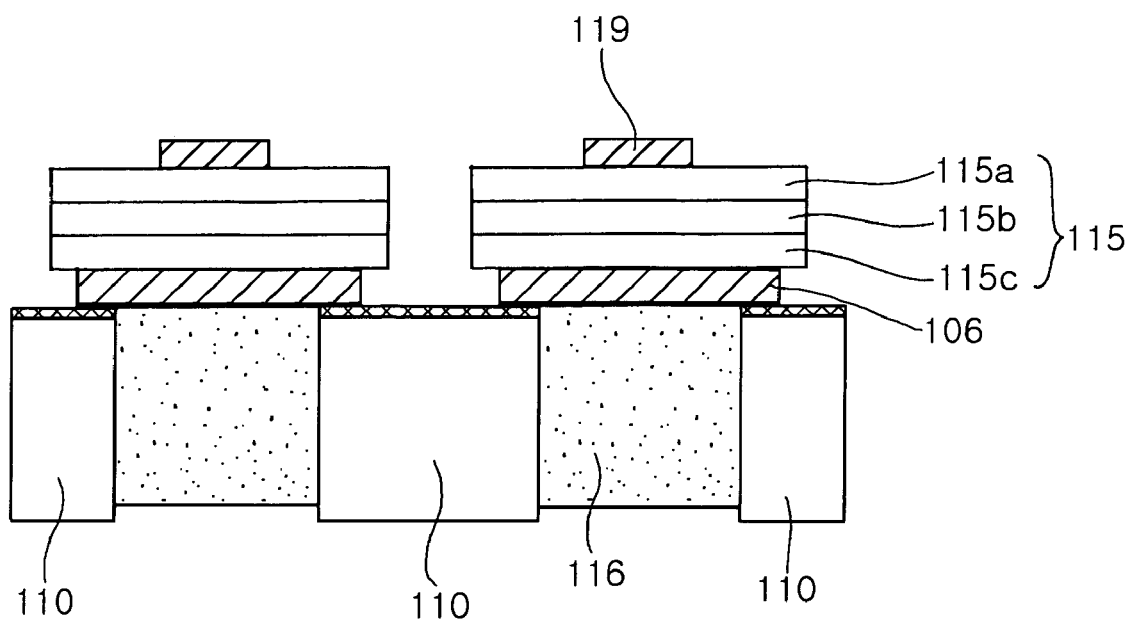

Then, as shown in FIG. 7, n-electrodes 119 are formed on the n-type clad layer 115a which is exposed due to removal of the sapphire substrate 101. The n-electrodes are made of one selected from a group consisting of Ti, Cr and Al and formed by patterning a metal layer via a lift-off process. FIG. 7 illustrates an inverted structure of FIG. 6. Preferably, prior to forming of the n-electrodes 119, a top surface of the n-clad layer 115a exposed by removal of the sapphire substrate 101 is washed and etched.

Figure 8:
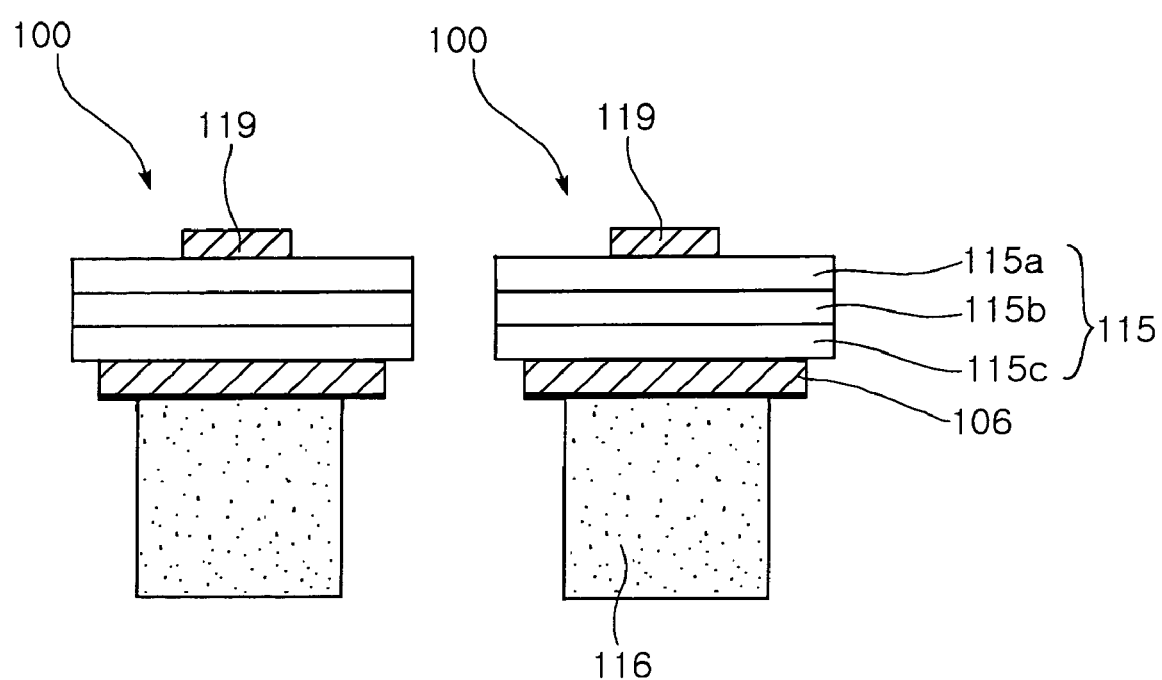

Thereafter, as shown in FIG. 8, the glass substrate 110 is removed via etching. The glass substrate 110, for example, is easily removable using a HF-based etchant. This produces a plurality of vertical light emitting diodes 100 separated into individual devices.

As described above, according to the embodiment of the invention, the glass substrate 10 is etched to easily separate the light emitting diodes 100 into individual devices without performing dicing or scribing. This alleviates manufacturing costs and time, which are increased with the dicing process.

Moreover, according to the embodiment of the invention, plating is carried out at a room temperature and atmospheric pressure in place of bonding of the conductive substrate as in the prior art. This prevents the p-electrodes from suffering deteriorated properties and cracks, which may arise from bonding of the conductive substrate. Further, the plating layer 116 made of a metal material (e.g. Au, Cu, Ni) with high thermal conductivity is used as the conductive substrate of the individual diode 100, thereby achieving superior heat releasing effects. This accordingly prevents degradation in LED chip properties even at a high current.

In the embodiments described above, the sapphire substrate 101 is employed as a growth substrate and the light emitting structure is made of a semiconductor material having a composition expressed by $Al_xGa_yIn_{(1-x-y)}N$, where $0 \leq x \leq 1$, $0 \leq y \leq 1$, $0 \leq x+y \leq 1$. But the invention is not limited thereto and may adopt other group III-V compound semiconductor.

For example, in another embodiment of the invention, the sapphire substrate 101 may be substituted by a GaAs substrate and the light emitting structure 115 may adopt a semiconductor material having a composition expressed by $Al_xGa_yIn_{(1-x-y)}P$, where $0 \leq x \leq 1$, $0 \leq y \leq 1$ and $0 \leq x+y \leq 1$ in place of the semiconductor material having a composition expressed by $Al_xGa_yIn_{(1-x-y)}N$, where $0 \leq x \leq 1$, $0 \leq y \leq 1$ and $0 \leq x+y \leq 1$. In addition, in further another embodiment, the sapphire substrate 101 may be substituted by a GaAs substrate and the light emitting structure 115 may adopt a semiconductor material having a composition expressed by $Al_xGa_{1-x}As$, where $0 \leq x \leq 1$.

As set forth above, according to preferred embodiments of the invention, a glass substrate is etched to individually separate chips with ease without performing dicing or scribing. This reduces increase in manufacturing costs and time resulting from such dicing or scribing. Also, a conductive substrate is formed via plating in place of bonding, thereby rendering the substrate free from cracks. In addition, a metal material with high thermal conductivity is employed as a conductive substrate of an individual light emitting diode, thereby achieving superior heat releasing effects.

While the present invention has been shown and described in connection with the preferred embodiments, it will be apparent to those skilled in the art that modifications and variations can be made without departing from the spirit and scope of the invention as defined by the appended claims.

What is claimed is:

1. A method for manufacturing a vertical light emitting diode comprising steps of:

forming a light emitting structure having an n-type clad layer, an active layer and a p-type clad layer sequentially formed therein on a growth substrate having a plurality of device areas and at least one device isolation area;

forming corresponding p-type electrodes on the light emitting structure on the device areas;

providing a glass substrate having through holes perforated therein on the p-electrodes so that the through holes are disposed corresponding to the p-electrodes;

plating the through holes with a metal material to form patterns of a plating layer on the p-electrodes;

removing the growth substrate to form n-electrodes on the n-type clad layer; and removing the glass substrate via etching.

2. The method according to claim 1, wherein the step of providing the glass substrate on the p-electrodes comprises: bonding the glass substrate having the through holes perforated therein onto the p-electrodes.

3. The method according to claim 1, wherein the step of providing the glass substrate on the p-electrodes comprises:
bonding the glass substrate onto the p-electrodes;
perforating the through holes in the glass substrate so that the through holes are disposed corresponding to the p-electrodes.

4. The method according to claim 1, further comprising: between the step of forming the light emitting structure and forming the p-electrodes, forming a trench in the light emitting structure on the device isolation area to separate the light emitting structure into individual device areas.

5. The method according to claim 1, further comprising: after forming the p-electrodes, forming a trench in the light emitting structure on the device isolation area to separate the light emitting structure into individual device areas.

6. The method according to claim 1, wherein the plating layer comprises one selected from a group consisting of Au, Cu, Ni, Ag, Cr, W, Al, Pt, Sn, Pb, Fe, Ti, Mo, and alloys thereof.

7. The method according to claim 1, further comprising: before forming the patterns of the plating layer, forming a plating seed layer on the p-electrodes.

8. The method according to claim 1, wherein the plating seed layer is formed via electro less plating or deposition.

9. The method according to claim 1, wherein the step of removing the growth substrate is carried out by one selected from a group consisting of physical, chemical and mechanical methods.

10. The method according to claim 9, wherein the growth substrate is removed by laser lift-off.

11. The method according to claim 1, wherein the n-type clad layer, the active layer and the p-type clad layer are made of a group III-V compound semiconductor material.

12. The method according to claim 1, wherein the p-type clad layer, the active layer and the p-type clad layer are made of a semiconductor material having a composition expressed by $Al_xGa_yIn_{(1-x-y)}P$, where $0 \leq x \leq 1$, $0y \leq 1$, $0 \leq x+y \leq 1$.

13. The method according to claim 12, wherein the growth substrate comprises a sapphire substrate.

14. The method according to claim 1, wherein the n-type clad layer, the active layer and the p-type clad layer are made of a semiconductor material having a composition expressed by $Al_xGa_yIn_{(1-x-y)}P$, where $0 \leq x \leq 1$, $0 \leq y \leq 1$, $0 \leq x+y \leq 1$.

15. The method according to claim 1, wherein the n-type clad layer, the active layer and the p-type clad layer are made of a semiconductor material having a composition expressed by $Al_xGa_{1-x}As$, where $0 \leq x \leq 1$.

* * * * *